United States Patent
Aram et al.

(10) Patent No.: US 6,972,916 B1
(45) Date of Patent: Dec. 6, 2005

(54) PREAMPLIFIER ARRANGED IN PROXIMITY OF DISK DRIVE HEAD

(75) Inventors: Farbod Aram, Cupertino, CA (US); Sehat Sutardja, Los Altos Hills, CA (US)

(73) Assignee: Marvell International Ltd., Hamilton (BM)

(*) Notice: Subject to any disclaimer, the term of this patent is extended or adjusted under 35 U.S.C. 154(b) by 295 days.

(21) Appl. No.: 10/389,825

(22) Filed: Mar. 17, 2003

(51) Int. Cl.⁷ ................................................ G11B 5/09
(52) U.S. Cl. ..................... 360/46; 360/67; 360/68; 327/108; 327/110
(58) Field of Search ................. 360/46, 68, 66–67; 327/108, 110, 132, 365

(56) References Cited

U.S. PATENT DOCUMENTS

| | | | | |
|---|---|---|---|---|
| 5,822,141 A | | 10/1998 | Chung et al. | |
| 5,869,988 A | * | 2/1999 | Jusuf et al. | 327/110 |
| 5,880,626 A | * | 3/1999 | Dean | 327/552 |
| 5,939,940 A | | 8/1999 | Patti | |
| 6,040,954 A | | 3/2000 | Tanghe | |
| 6,107,873 A | | 8/2000 | Lorenz | |
| 6,175,463 B1 | * | 1/2001 | Nayebi et al. | 360/68 |
| 6,185,057 B1 | | 2/2001 | Masenas | |
| 6,285,221 B1 | * | 9/2001 | Leighton et al. | 327/110 |
| 6,307,695 B1 | * | 10/2001 | Bhandari | 360/46 |
| 6,496,317 B2 | * | 12/2002 | Lacombe | 360/68 |
| 6,665,135 B2 | * | 12/2003 | Kim et al. | 360/46 |
| 6,798,597 B1 | | 9/2004 | Aram et al. | |
| 6,831,800 B2 | * | 12/2004 | Ranmuthu | 360/68 |

* cited by examiner

*Primary Examiner*—David Hudspeth
*Assistant Examiner*—Natalia Figueroa

(57) ABSTRACT

A magnetic storage system includes a preamplifier writer that selectively drives a write current through a write head to write data to a magnetic storage medium. The write current generated by the preamplifier writer has a boost stage and a settling stage. An impedance changing circuit communicates with the preamplifier writer and the write head and provides a lower resistance value during the boost stage and a higher resistance value during the settling stage.

67 Claims, 8 Drawing Sheets

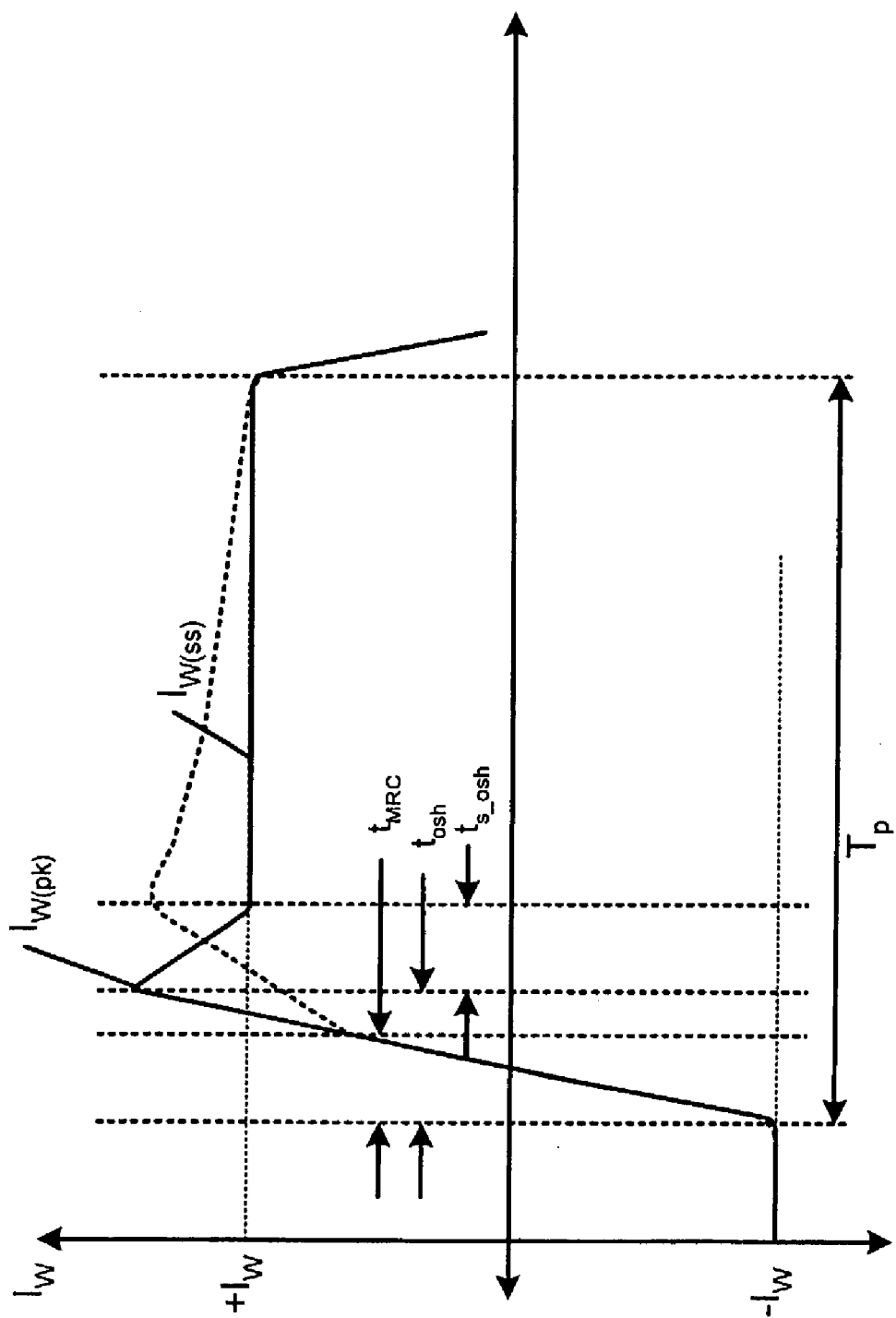

PREAMPLIFIER ARRANGED IN PROXIMITY OF DISK DRIVE HEAD

FIELD OF THE INVENTION

The present invention relates to magnetic data storage systems, and more particularly to a preamplifier writer for a write head in a magnetic data storage system operating at high data transfer rates.

BACKGROUND OF THE INVENTION

Conventional data storage systems typically write information onto a recording surface of a magnetic storage medium. These systems typically include a write head and a write driver circuit. The magnetic storage medium may be a disk drive of a computer. The write head may be an inductive coil, although other types of write heads may be used.

Information is written to the magnetic storage medium by switching a direction of current flowing through the write head. A magnetic field that is produced by the write head is stored by the magnetic storage medium. One polarity represents one digital value and the opposite polarity represents the other digital value. Data storage rates of these systems are proportional to a rate that the write driver circuit can change the direction of the write current through the write head.

SUMMARY OF THE INVENTION

A magnetic storage system includes a preamplifier writer that selectively drives a write current through a write head to write data to a magnetic storage medium. The write current generated by the preamplifier writer has a boost stage and a settling stage. An impedance changing circuit communicates with the preamplifier writer and the write head and provides a lower resistance value during the boost stage and a higher resistance value during the settling stage.

In other features, the write current transitions from one of a steady state positive write current to a peak negative write current and a steady state negative write current to a peak positive write current during the boost stage. The write current transitions from one of the peak negative write current to the peak steady state negative write current and the peak positive write current to the steady state positive write current during the settling stage.

In still other features, the lower resistance value during the boost stage increases a maximum rate change period $t_{MRC}$ of the write current and the higher resistance value during the settling stage reduces a settling period $t_s$ of the write current.

In yet other features, the impedance changing circuit includes a settling resistance having one end that communicates with the preamplifier writer and an opposite end that communicates with the write head. A boost resistance is in series with a switching device. The boost resistance and the switching device are in parallel with the settling resistance. The switching device is closed during the boost stage and open during the settling stage.

In still other features, the impedance changing circuit includes a settling resistance having one end that communicates with the preamplifier writer. A switching device is in parallel with the settling resistance. A boost resistance has one end that communicates with the settling resistance and an opposite end that communicates with the write head. The switching device is closed during the boost stage and open during the settling stage.

In yet other features, the preamplifier writer has a transition period $T_p$ that is equal to a time period that is required to write data to the magnetic storage medium. The preamplifier writer and the write head are positioned on a read/write arm.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 6 illustrates a maximum rate of change time for the write current;

DETAILED DESCRIPTION OF THE PREFERRED EMBODIMENTS

Figure 1A:
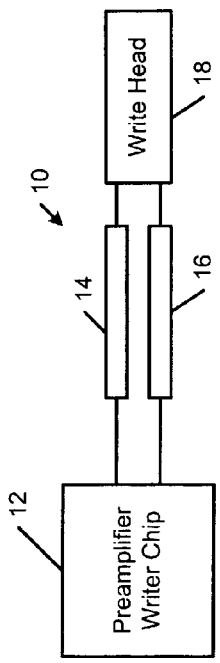
FIG. 1A is a functional block diagram of a preamplifier writer chip, transmission lines and a write head.

The following description of the preferred embodiment(s) is merely exemplary in nature and is in no way intended to limit the invention, its application, or uses. For purposes of clarity, the same reference numbers will be used in the drawings to identify the same elements.

Figure 1C:
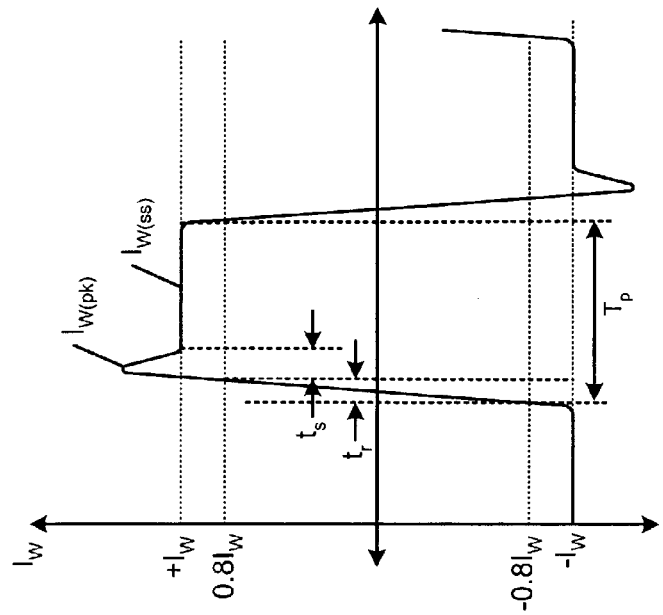
FIG. 1C is a graph illustrating write current as a function of time.
Figure 1B:
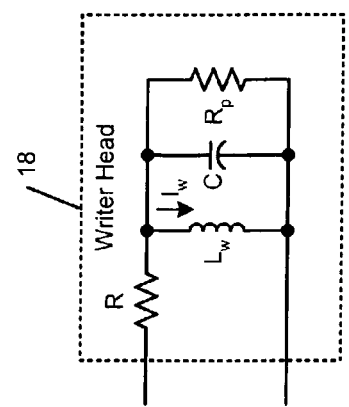
FIG. 1B illustrates an equivalent circuit for the write head.

Referring now to FIG. 1A, a write circuit 10 includes a preamplifier writer integrated circuit or chip 12 that is connected by transmission lines 14 and 16 to a write head 18. In FIG. 1B, an equivalent circuit for the write head 18 is shown and includes a series resistance R, an inductance $L_w$, a capacitance C in parallel with the inductance $L_w$, and a parallel resistance $R_p$.

The transmission lines 14 and 16 introduce delays into the system. For example, a 5" connection introduces a delay of 200 ps for 2 GHz systems. The transmission line also has an impedance $Z_O$ of approximately 500 Ω. Other delays and impedances can be used depending upon the particular design criteria and operating speeds. Typical values for the resistance $R_p$ is approximately 300 Ω. Likewise, typical values for the capacitance is approximately 300 ff and for the inductance $L_w$, is approximately 10 nH.

During operation, the write circuit 10 drives the write current $I_w$ through the write head $L_w$. For high speed operation, the write circuit 10 should be able to switch the direction of the current very fast. Referring now to FIG. 1C, the write current $I_w$ is shown as a function of time. The write current swings between steady state values of $-I_w$ and $+I_w$. A rise time $t_r$ is typically defined as the amount of time that is required to transition from 10% to 90% of the steady state values of $-I_w$ and $+I_w$, although the rise time can be defined in other ways. The setting time $t_s$ is typically defined as the amount of time required for the write current to transition from the end of the rise time to a steady state value, although the settling time can be different in other ways. In other words, the settling time $t_s$ is from the end of the rise time $t_r$ to the time that the write current asymptotically reaches the steady state write current value. The width of the transition period $T_p$ depends upon the desired write speed. For example, a magnetic storage system operating at 2 GHz system has a transition period of 500 ps, although other periods may be used. The write current overshoots the steady state $I_w(ss)$ value to overcome hysteresis in the magnetization process. In other words, the write current reaches a peak write current $I_w(pk)$ before setting to the steady state value $I_w(ss)$. Preferably, $I_w(pk)>I_w(ss)$, $t_r$ is short in duration and tS is very fast for magnetic storage systems.

Figure 2:
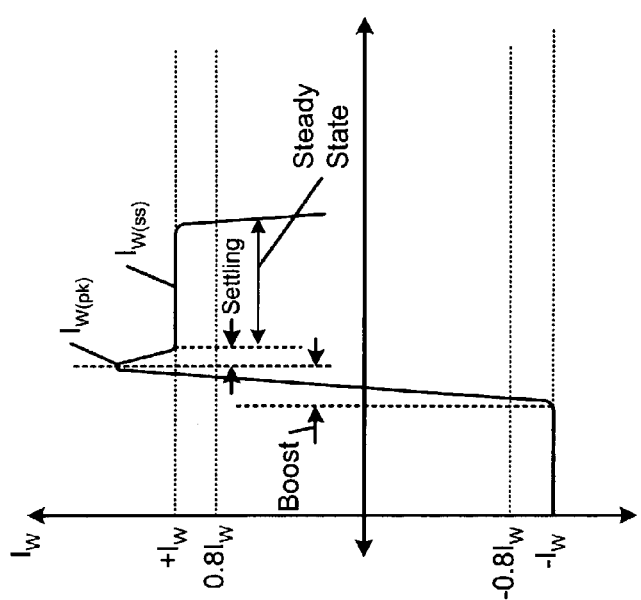
FIG. 2 illustrates a boost stage, a settling stage and a steady state stage of the write current.

Referring now to FIG. 2, in write circuits 10, there are two stages of operation: boost and settling stages. The boost stage occurs when the write current transitions from a steady state positive write current to a peak negative write current and from a steady state negative write current to a peak positive write current. The settling stage occurs when the write current transitions from the peak negative write current to the peak steady state negative write current and from the peak positive write current to the steady state positive write current. The write circuit preferably operates the same for the settling period and the steady state period.

Figure 3B:
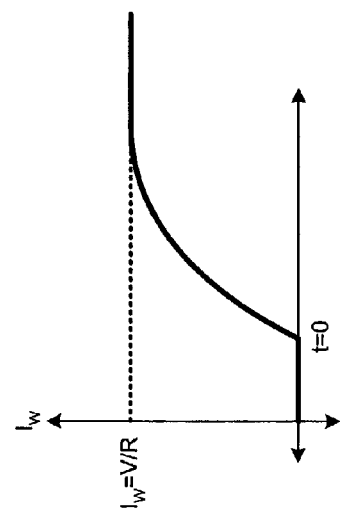
FIG. 3B illustrates write current as a function of time for a step voltage input.
Figure 3A:
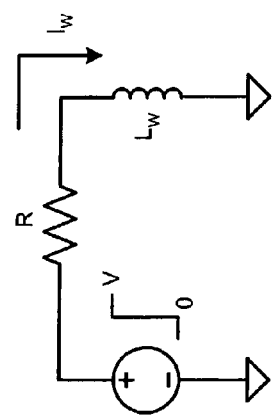
FIG. 3A illustrates an equivalent write circuit during the boost stage.

In FIGS. 3A and 3B, an equivalent circuit is shown in the boost stage. For a step voltage change from 0 to V at time 0, the write current $I_w$ increases from 0 to $$\frac{V}{R}$$

as shown in FIG. 3B. More particularly, $$I_w = \frac{V}{R}\left(1 - e^{-\left(\frac{t}{\tau}\right)}\right)$$

where $$\tau = \frac{L}{R}.$$

for t<<τ, $$I_w \approx \frac{V}{R}\left[1 - \left(1 + \frac{t}{\tau}\right)\right]$$

and $$\Delta I_w = \frac{V}{R}\left(\frac{t}{\tau}\right) = \frac{V}{R}\left(\frac{t}{\tau}\right)R = V\frac{t}{\tau}.$$

Therefore, there is a certain amount of time when t<<τ to change $I_w$ at the highest rate. Beyond that time, the write circuit boost is far less effective.

Figure 4A:
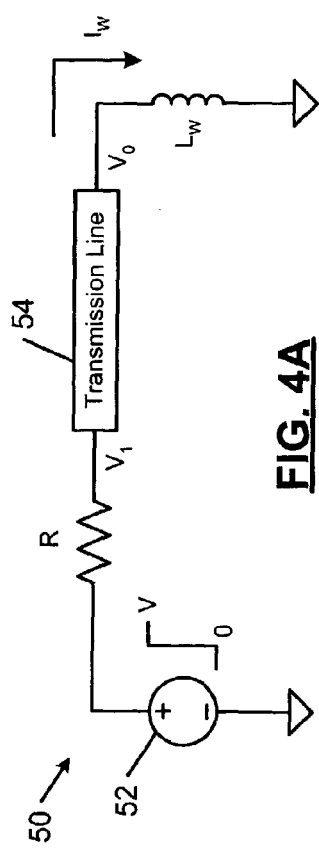
FIG. 4A illustrates the write circuit with the transmission line.
Figure 4B:
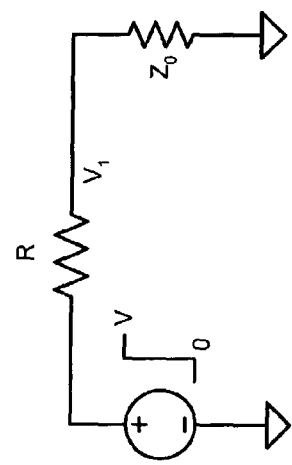
FIG. 4B illustrates the write circuit for time less or equal to twice a transmission line delay period.

Referring now to FIG. 4A, a simplified preamplifier writer circuit 50 is shown and includes a voltage source 52, a source resistance R, a transmission line 54 and a write head inductor $L_w$. Assuming that the time delay is equal to $T_D$ and that the transmission line is matched to the source at all times (R=$Z_O$), an equivalent circuit shown in FIG. 4B is applicable for t≦2$T_D$. Typical values for a 2 GHz circuit would be Tp=500 ps, $T_D$=200 ps and 2$T_D$=400 ps. For t≦2$T_D$ $$V_1 = \frac{V}{2}$$

if $Z_O$=R. In other words, half of the voltage V is sent to the write head. However, due to the transmission line effect, $V_O$ sees 2$V_1$=V.

Figure 4C:
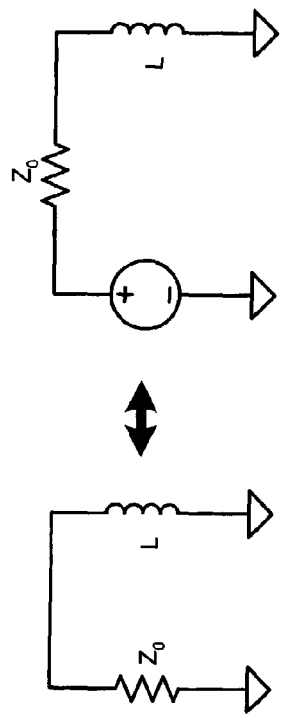
FIG. 4C illustrates the circuit seen by the write head for time less or equal to twice the transmission line delay period.

For t<2$T_D$, the write head sees the circuit shown on the left in FIG. 4C, which is similar to the circuit shown on the right in FIG. 4C. Using typical values for $T_D$, 2$T_D$, $Z_O$, $L_w$ and R, the values for τ beyond which the boost is not efficient can be identified. For example, using $T_D$=200 ps, 2$T_D$=400 ps, $Z_O$ =1000 Ω, $L_w$=10 nH and R=150 Ω

$$\tau \leq \frac{10nH}{150\,\Omega} < 100 \text{ ps.}$$

In other words, the boost will be most effective for τ≦100 ps for these circuit values. Additional requirements may include $I_w(pk)=P[I_w(ss)]$, where P is greater than 1. In some circuits, P can be set equal 2 or larger values. Therefore, $t_s$ must be very fast before next write cycle such that $t_r+t_s<T_p$.

As discussed above, the available time for effectively changing $I_w$ at the highest rate is for τ≦100 ps. For example, $$\Delta I_w = \frac{V\tau}{L};$$

In this example, τ≦100 ps, V=10V−2$V_{be}$ 8V for bipolar transistors, L=10nH;

Therefore, $$\Delta I_w = \frac{V\tau}{L} = \frac{(8)(100 \text{ ps})}{10nH} = 80 \text{ mA}.$$

Figure 5:
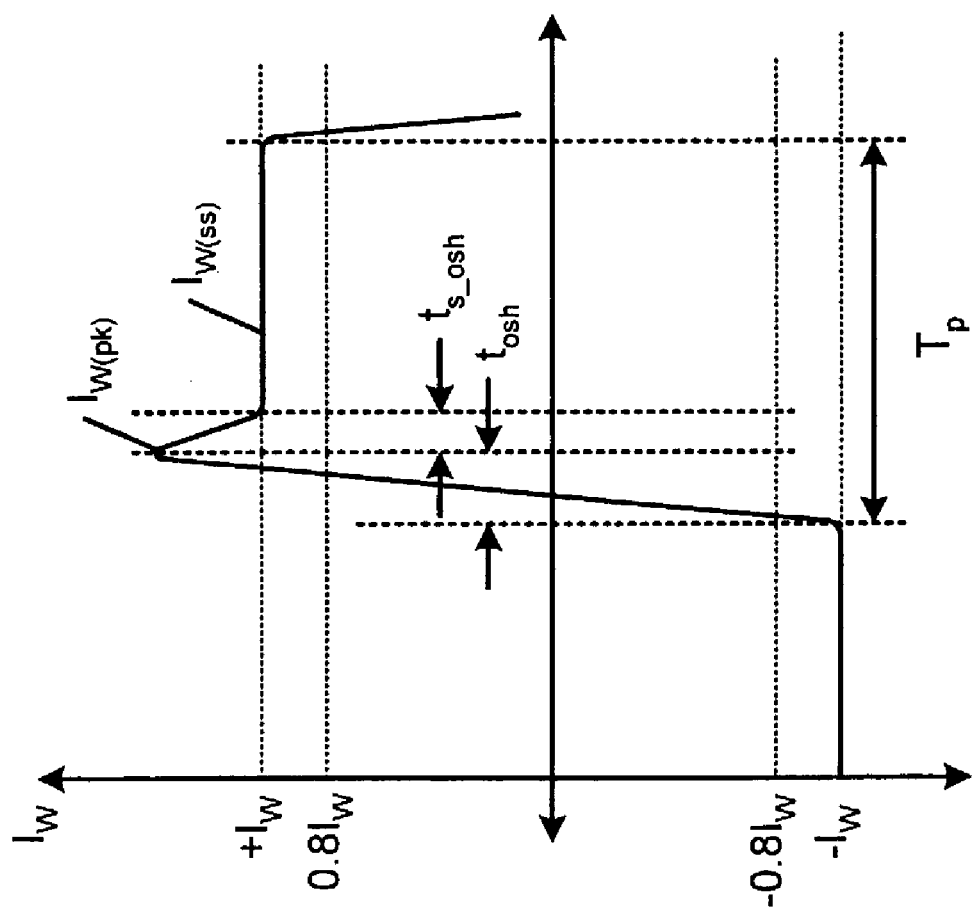
FIG. 5 illustrates overshoot time and overshoot settling time for the write current.

Referring now to FIG. 5, the overshoot time $t_{osh}$ is defined as the time from the prior steady state $I_w(ss)$ (of one polarity) to the peak $I_w(pk)$ (of the opposite polarity). The overshoot setting time $t_{s\_osh}$ is defined as the time from the peak $I_w(pk)$ to a time when the write current asymptotically reaches the $I_w(ss)$ value.

Referring now to FIG. 6, the time period for the maximum rate of change $t_{MRC}$ of $I_w$ is equal to $$\frac{L}{R}$$

and is preferably greater than or equal to $t_{osh}$. Otherwise, the write current will not quickly reach $I_w(pk)$ and the overshoot time $t_{osh}$ will increase. Therefore to enlarge $t_{MRC}$ to allow the peak write current to be reached more quickly (reducing $t_{osh}$), the boost requires a small value for $Z_0=R$. Since the write head needs to be matched to the transmission line for operation beyond 2 GHz, the write resistance R must also be low. Having a low write resistance R, however, increases the steady state time $t_s$.

Figure 7:
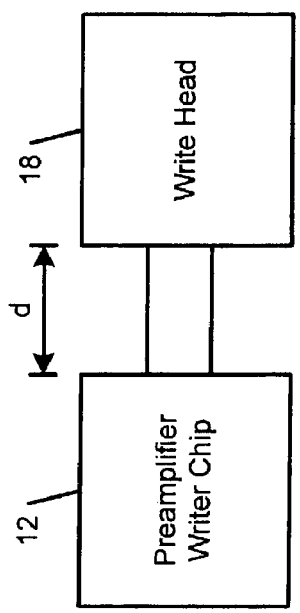
FIG. 7 illustrates the preamplifier writer chip located at a distance d from the write head to substantially reduce transmission line effects.

According to the present invention, an impedance changing circuit decreases the resistance R during the boost stage to increase $t_{MRC}$. During the steady state stage, the impedance changing circuit increases R to minimize $t_s$. Referring now to FIG. 7, the preamplifier writer is positioned at a distance d from the write head to significantly reduce the effect of transmission lines. In convention systems, the preamplifier writer is positioned approximately 5" from the write head for 2 GHz operation, which creates transmission lines having delay effects that are described above. In a preferred embodiment, the preamplifier writer chip is positioned such that the transmission line delays have minimal effect. For example, a delay of approximately 10% of the transmission period $T_p$ or less typically has a minimal effect. However, skilled artisans will appreciate that delays of 15%, 20% and 25% will also work with somewhat reduced performance.

By reducing the transmission line to approximately 10% of $T_p$, the transmission line effects are significantly reduced. In addition to positioning the preamplifier writer close to the write head, the resistance R is changed during the boost and settling stages to increase $t_{MRC}$ and to reduce $t_s$. More particularly, the resistance R is set low during the boost stage to maximize $t_{MRC}$. The resistance R is set high during the settling stage to minimize $t_s$.

Figure 8:
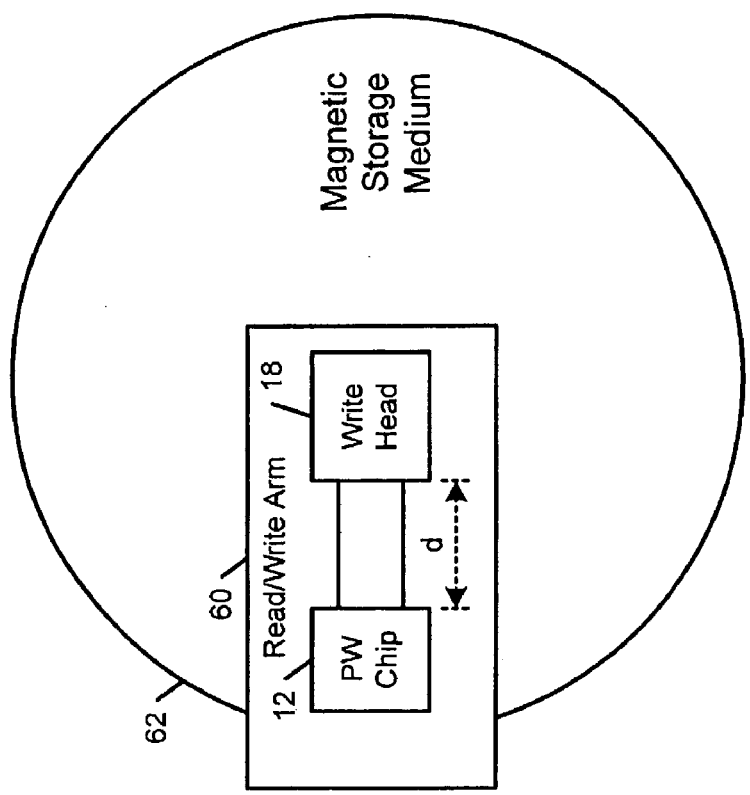
FIG. 8 illustrates the preamplifier writer chip located on a read/write arm of the magnetic storage device.

For example, if $T_p$ is equal to 500 ps for 2 GHz operation, conventional preamplifier writers would be positioned approximately d=5" and have a delay of 200 ps. According to the present invention, the preamplifier writer chip would be positioned at a distance d such that the delay is equal to $T_p/10$ from the write head. Thus, using the same example set forth above for 2 GHz operation, the preamplifier writer chip is positioned at approximately (5")(50 ps/200 ps)=5"/4=1.25" or less from the write head. Referring now to FIG. 8, the preamplifier writer 12 and the write head 18 are positioned on a read/write arm 60 when the distance d is less than ½ of the diameter of a magnetic storage medium 62.

Figure 9:
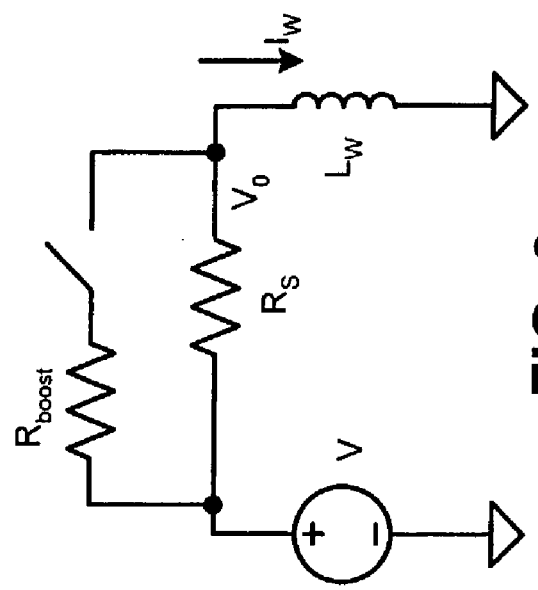
FIG. 9 illustrates a first exemplary switched resistance circuit that provides a lower resistance during the boost stage and a higher resistance during the settling stage.

Referring now to FIG. 9, the impedance changing circuit can be implemented in a variety of ways. For example, the impedance changing circuit can include a boost resistor $R_{boost}$ and a switch. When the switch is open, the resistance is equal to $R_s$. When the switch is closed, the resistance is equal to $$\frac{R_{boost}R_s}{R_{boost} + R_s}.$$

If $R_{boost} << R_s$, the resistance during the boost stage is much less than the resistance during the settling stage.

Figure 10:
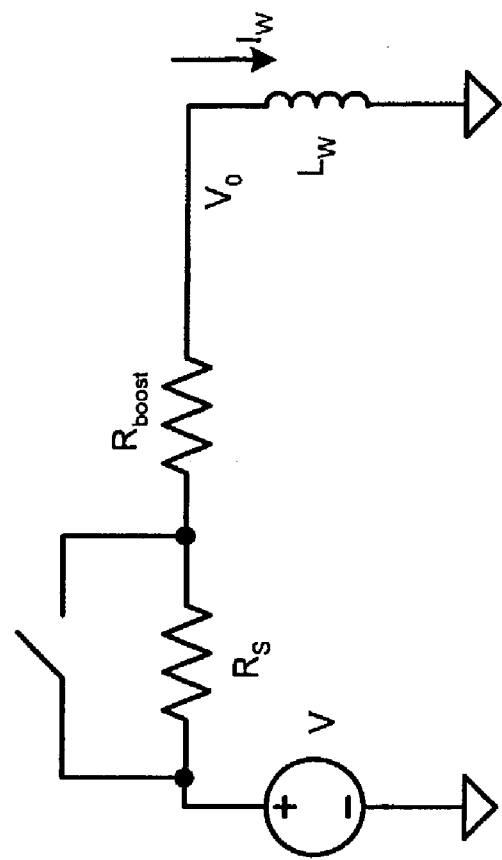
FIG. 10 illustrates a second exemplary switched resistance circuit that provides a lower resistance during the boost stage and a higher resistance during the settling stage.

Referring now to FIG. 10, the impedance changing circuit can include a boost resistor $R_{boost}$ and a switch that is in series with the settling resistor. When the switch is closed during the boost stage, the settling resistor is shorted and the resistance is equal to $R_{boost}$. When the switch is opened during the settling stage, the resistance is equal to $R_{boost}+R_s$. If $R_{boost} << R_s$, then the resistance during the boost stage is much less than the resistance during the settling stage. As can be appreciated, the switches can be implemented using transistors or in any other suitable manner. Likewise the resistances can be implemented using resistors, poly resistors, inherent resistance of traces, or in any other manner.

Figure 11:
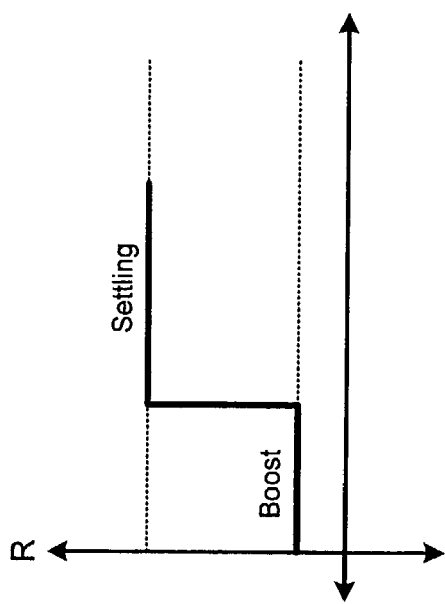
FIG. 11 illustrates the switched resistance as a function of the boost and settling stages.

During the boost stage, the resistance is reduced. During the settling stage, the resistance is increased. In FIG. 11, the resistance is shown as a function of the boost and settling stages. The resistance increases from the boost stage to the settling stage.

Figure 12:
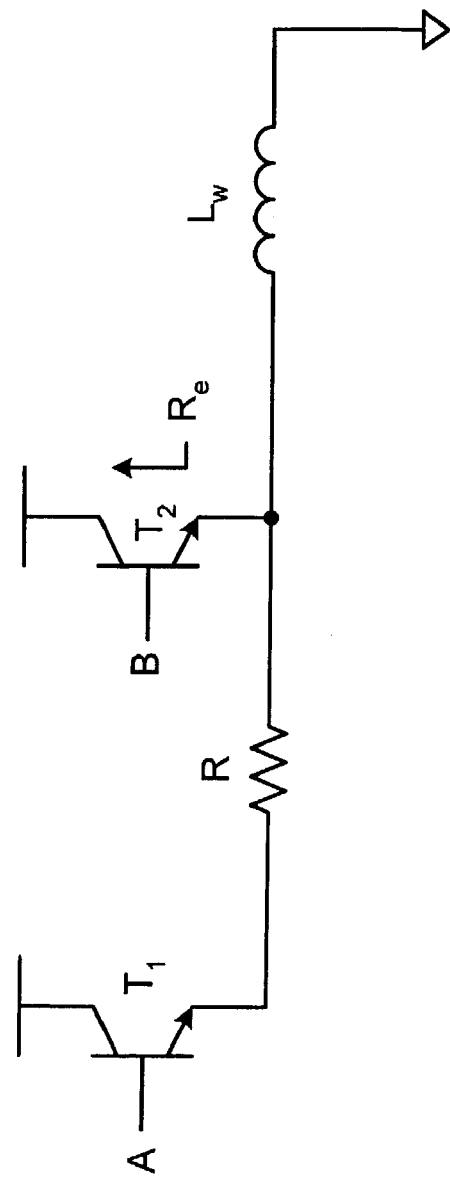
FIG. 12 illustrates a third exemplary switched resistance.

Referring now to FIG. 12, an alternate impedance changing circuit is shown. First and second transistors $T_1$ and $T_2$ have emitters that are connected to one end of the write head $L_w$. A base of the first transistor $T_1$ is connected to a bias voltage A. A base of the second transistor $T_2$ is connected to a bias voltage B. A resistor R is connected between the emitter of the first transistor $T_1$ and the emitter of the second transistor $T_2$. When A>B, the resistor R is in circuit and the resistance is increased during the settling stage. When B>A, an emitter resistance $R_e$ shorts R, which reduces the resistance during the boost stage. Still other impedance changing circuits are contemplated.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A magnetic storage system that writes data to a magnetic storage medium, comprising:
   a write head;
   a preamplifier writer that selectively drives a write current through said write head to write data to the magnetic storage medium, wherein said write current generated by said preamplifier writer has a boost stage and a settling stage; and
   an impedance changing circuit that communicates with said preamplifier writer and said write head and that provides a lower resistance value during said boost stage and a higher resistance value during said settling stage.

2. The magnetic storage system of claim 1 wherein said write current transitions from one of a steady state positive write current to a peak negative write current and a steady state negative write current to a peak positive write current during said boost stage.

3. The magnetic storage system of claim 1 wherein said write current transitions from one of said peak negative write current to said peak steady state negative write current and said peak positive write current to said steady state positive write current during said settling stage.

4. The magnetic storage system of claim 1 wherein said lower resistance value during said boost stage increases a maximum rate change period $t_{MRC}$ of said write current and said higher resistance value during said settling stage reduces a settling period $t_s$ of said write current.

5. The magnetic storage system of claim 1 wherein said impedance changing circuit includes:
  a settling resistance having one end that communicates with said preamplifier writer and an opposite end that communicates with said write head;
  a switching device; and
  a boost resistance in series with said switching device, wherein said boost resistance and said switching device are in parallel with said settling resistance.

6. The magnetic storage system of claim 5 wherein said switching device is closed during said boost stage and open during said settling stage.

7. The magnetic storage system of claim 1 wherein said impedance changing circuit includes:
  a settling resistance having one end that communicates with said preamplifier writer;
  a switching device in parallel with said settling resistance; and
  a boost resistance having one end that communicates with said settling resistance and an opposite end that communicates with said write head.

8. The magnetic storage system of claim 7 wherein said switching device is closed during said boost stage and open during said settling stage.

9. The magnetic storage system of claim 1 wherein said preamplifier writer has a transition period $T_p$ that is equal to a time period that is required to write data to the magnetic storage medium, wherein $T_p$ is less than or equal to 500 ps, and wherein said preamplifier writer is spaced at a distance that is less than or equal to a transmission line time delay of $T_p/4$.

10. The magnetic storage system of claim 9 wherein said preamplifier writer is spaced at a distance that is less than or equal to a transmission line time delay of $T_p/10$.

11. The magnetic storage system of claim 1 further comprising a read/write arm of said magnetic storage system, wherein said preamplifier writer and said write head are positioned on said read/write arm.

12. The magnetic storage system of claim 11 wherein said write head includes an inductor.

13. A magnetic storage system that writes data to a magnetic storage medium, comprising:
  field generating means for generating a magnetic field that stores data on the magnetic storage medium;
  preamplifier writing means that selectively drives a write current through said field generating means to write data to the magnetic storage medium, wherein said write current generated by said preamplifier writing means has a boost stage and a settling stage; and
  impedance changing means that communicates with said preamplifier writing means and said field generating means and that provides a lower resistance value during said boost stage and a higher resistance value during said settling stage.

14. The magnetic storage system of claim 13 wherein said write current transitions from one of a steady state positive write current to a peak negative write current and a steady state negative write current to a peak positive write current during said boost stage.

15. The magnetic storage system of claim 13 wherein said write current transitions from one of said peak negative write current to said peak steady state negative write current and said peak positive write current to said steady state positive write current during said settling stage.

16. The magnetic storage system of claim 13 wherein said lower resistance value during said boost stage increases a maximum rate change period tmRC of said write current and said higher resistance value during said settling stage reduces a settling period $t_s$ of said write current.

17. The magnetic storage system of claim 13 wherein said impedance changing means includes:
  a settling resistance having one end that communicates with said preamplifier writing means and an opposite end that communicates with said field generating means;
  a switching device; and
  a boost resistance in series with said switching device, wherein said boost resistance and said switching device are in parallel with said settling resistance.

18. The magnetic storage system of claim 17 wherein said switching device is closed during said boost stage and open during said settling stage.

19. The magnetic storage system of claim 13 wherein said impedance changing means includes:
  a settling resistance having one end that communicates with said preamplifier writing means;
  a switching device in parallel with said settling resistance; and
  a boost resistance having one end that communicates with said settling resistance and an opposite end that communicates with said field generating means.

20. The magnetic storage system of claim 19 wherein said switching device is closed during said boost stage and open during said settling stage.

21. The magnetic storage system of claim 13 wherein said preamplifier writing means has a transition period $T_p$ that is equal to a time period that is required to write data to the magnetic storage medium, and wherein said preamplifier writing means is spaced at a distance that is less than or equal to a transmission line time delay of $T_p/4$, and wherein $T_p$ is less than or equal to 500 ps.

22. The magnetic storage system of claim 21 wherein said preamplifier writing means is spaced at a distance that is less than or equal to a transmission line time delay of $T_p/10$.

23. The magnetic storage system of claim 13 further comprising a read/write arm of said magnetic storage system, wherein said preamplifier writing means and said field generating means are positioned on said read/write arm.

24. The magnetic storage system of claim 23 wherein said field generating means includes an inductor.

25. A method of operating magnetic storage system that writes data to a magnetic storage medium, comprising:
  selectively driving a write current through a write head to write data to the magnetic storage medium;
  defining a boost stage and a settling stage in said write current;
  providing a lower resistance value between said write head and said preamplifier writer during said boost stage; and providing a higher resistance value between said write head and said preamplifier writer during said settling stage.

26. The method of claim 25 wherein said write current transitions from one of a steady state positive write current to a peak negative write current and a steady state negative write current to a peak positive write current during said boost stage.

27. The method of claim 25 wherein said write current transitions from one of said peak negative write current to said peak steady state negative write current and said peak positive write current to said steady state positive write current during said settling stage.

28. The method of claim 25 wherein said lower resistance value during said boost stage increases a maximum rate change period $t_{MRC}$ and said higher resistance value during said settling stage reduces a settling period $t_s$.

29. The method of claim 28 further comprising spacing said preamplifier writer at a distance that is less than or equal to a transmission line time delay of $T_p/4$.

30. The method of claim 28 wherein said preamplifier writer is spaced at a distance that is less than or equal to a transmission line time delay of $T_p/10$.

31. The method of claim 25 wherein said preamplifier writer has a transition period $T_p$ that is equal to a time period that is required to write data to the magnetic storage medium and wherein $T_p$ is less than or equal to 500 ps.

32. The method of claim 25 further comprising positioning said preamplifier writer and said write head on said read/write arm.

33. A magnetic storage system that writes data to a magnetic storage medium, comprising:
a write head; and
a preamplifier writer that selectively drives a write current through said write head to write data to the magnetic storage medium and that has a transition period $T_p$ that is equal to a time period that is required to write data to the magnetic storage medium, wherein $T_p$ is less than or equal to 500 ps, and
wherein said preamplifier writer is spaced at a distance that is less than or equal to a transmission line time delay of $T_p/4$.

34. The magnetic storage system of claim 33 wherein said write current generated by said preamplifier writer has a boost stage and a settling stage.

35. The magnetic storage system of claim 34 wherein said write current transitions from one of a steady state positive write current to a peak negative write current and a steady state negative write current to a peak positive write current during said boost stage.

36. The magnetic storage system of claim 34 wherein said write current transitions from one of said peak negative write current to said peak steady state negative write current and said peak positive write current to said steady state positive write current during said settling stage.

37. The magnetic storage system of claim 34 further comprising an impedance changing circuit that communicates with said preamplifier writer and said write head and that provides a lower resistance value during said boost stage and a higher resistance value during said settling stage.

38. The magnetic storage system of claim 37 wherein said lower resistance during said boost stage increases a maximum rate of change period $t_{MRC}$ and said higher resistance during said settling stage reduces a settling period $t_s$.

39. The magnetic storage system of claim 37 wherein said impedance changing circuit includes:

a settling resistance having one end that communicates with said preamplifier writer and an opposite end that communicates with said write head;
a switching device; and
a boost resistance in series with said switching device, wherein said boost resistance and said switching device are in parallel with said settling resistance.

40. The magnetic storage system of claim 39 wherein said switching device is closed during said boost stage and open during said settling stage.

41. The magnetic storage system of claim 37 wherein said impedance changing circuit further includes:
a settling resistance having one end that communicates with said preamplifier writer;
a switching device in parallel with said settling resistance; and
a boost resistance having one end that communicates with an opposite end of said settling resistance and an opposite end that communicates with said write head.

42. The magnetic storage system of claim 41 wherein said switching device is closed during said boost stage and open during said settling stage.

43. The magnetic storage system of claim 33 wherein the preamplifier writer is implemented on a chip.

44. The magnetic storage system of claim 33 wherein said preamplifier writer is spaced at a distance that is less than or equal to a transmission line time delay of $T_p/10$.

45. The magnetic storage system of claim 33 further comprising a read/write arm of said magnetic storage system, wherein said preamplifier writer and said write head are positioned on said read/write arm.

46. The magnetic storage system of claim 33 wherein said write head includes an inductor.

47. A magnetic storage system that writes data to a magnetic storage medium, comprising:
field generating means for generating a magnetic field that stores data on the magnetic storage medium;
preamplifier writing means that selectively drives a write current through said field generating means to write data to the magnetic storage medium and that has a transition period $T_p$ that is equal to a time period that is required to write data to the magnetic storage medium, wherein $T_p$ is less than or equal to 500 ps, and
wherein said preamplifier writing means is spaced at a distance that is less than or equal to a transmission line time delay of $T_p/4$.

48. The magnetic storage system of claim 47 wherein said write current generated by said preamplifier writing means has a boost stage and a settling stage.

49. The magnetic storage system of claim 48 wherein said write current transitions from one of a steady state positive write current to a peak negative write current and a steady state negative write current to a peak positive write current during said boost stage.

50. The magnetic storage system of claim 48 wherein said write current transitions from one of said peak negative write current to said peak steady state negative write current and said peak positive write current to said steady state positive write current during said settling stage.

51. The magnetic storage system of claim 48 further comprising impedance changing means that communicates with said preamplifier writing means and said field generating means and that provides a lower resistance value during said boost stage and a higher resistance value during said settling stage.

52. The magnetic storage system of claim 51 wherein said lower resistance during said boost stage increases a maximum rate of change period $t_{MRC}$ and said higher resistance during said settling stage reduces a settling period $t_s$.

53. The magnetic storage system of claim 51 wherein said impedance changing means includes:
   a settling resistance having one end that communicates with said preamplifier writing means and an opposite end that communicates with said field generating means;
   a switching device; and
   a boost resistance in series with said switching device, wherein said boost resistance and said switching device are in parallel with said settling resistance.

54. The magnetic storage system of claim 53 wherein said switching device is closed during said boost stage and open during said settling stage.

55. The magnetic storage system of claim 51 wherein said impedance changing means further includes:
   a settling resistance having one end that communicates with said preamplifier writing means;
   a switching device in parallel with said settling resistance; and
   a boost resistance having one end that communicates with an opposite end of said settling resistance and an opposite end that communicates with said field generating means.

56. The magnetic storage system of claim 55 wherein said switching device is closed during said boost stage and open during said settling stage.

57. The magnetic storage system of claim 47 wherein the preamplifier writing means is implemented on a chip.

58. The magnetic storage system of claim 47 wherein said preamplifier writing means is spaced at a distance that is less than or equal to a transmission line time delay of $T_p/10$.

59. The magnetic storage system of claim 47 further comprising a read/write arm of said magnetic storage system, wherein said preamplifier writing means and said field generating means are positioned on said read/write arm.

60. The magnetic storage system of claim 47 wherein said field generating means includes an inductor.

61. A method of operating magnetic storage system that writes data to a magnetic storage medium, comprising:
   positioning a write head in proximity to the magnetic storage medium;
   selectively driving a write current through said write head to write data to the magnetic storage medium using a preamplifier writer, wherein said preamplifier writer has a transition period $T_p$ that is equal to a time period that is required to write data to the magnetic storage medium and wherein $T_p$ is less than or equal to 500 ps; and
   spacing said preamplifier writer at a distance that is less than or equal to a transmission line time delay of $T_p/4$ from said write head.

62. The method of claim 61 further comprising:
   defining a boost stage and a settling stage of said write current;
   providing a lower resistance value between said write head and said preamplifier writer during said boost stage; and
   providing a higher resistance value between said write head and said preamplifier writer during said settling stage.

63. The method of claim 62 wherein said write current transitions from one of a steady state positive write current to a peak negative write current and a steady state negative write current lo a peak positive write current during said boost stage.

64. The method of claim 62 wherein said write current transitions from one of said peak negative write current to said peak steady state negative write current and said peak positive write current to said steady state positive write current during said settling stage.

65. The method of claim 62 wherein said lower resistance value during said boost stage increases a maximum rate change period $t_{MRC}$ and said higher resistance value during said settling stage reduces a settling period $t_s$.

66. The method of claim 61 wherein said preamplifier writer is spaced at a distance that is less than or equal to a transmission line time delay of $T_p/10$.

67. The method of claim 61 further comprising positioning said preamplifier writer and said write head on said read/write arm.

* * * * *

UNITED STATES PATENT AND TRADEMARK OFFICE
CERTIFICATE OF CORRECTION

PATENT NO.       : 6,972,916 B1
APPLICATION NO.  : 10/389825
DATED            : December 6, 2005
INVENTOR(S)      : Aram et al.

It is certified that error appears in the above-identified patent and that said Letters Patent is hereby corrected as shown below:

Column 4, Line 41:   Delete "<" and insert -- $\leq$ --
Column 4, Line 46:   Delete "1000$\Omega$" and insert -- 100$\Omega$ --
Column 4, Line 66:   Insert -- $\approx$ -- after "$_{be}$"
Column 8, Line 13:   Delete "tmRC" and insert -- $t_{MRC}$ --
Column 12, Line 24:  Delete "lo" and insert -- to --

Signed and Sealed this

Fifth day of September, 2006

JON W. DUDAS
*Director of the United States Patent and Trademark Office*